United States Patent [19]

Nakaoka

[11] Patent Number: 5,245,573
[45] Date of Patent: Sep. 14, 1993

[54] SEMICONDUCTOR MEMORY DEVICE HAVING A SINGLE DATA BUS LINE CORRESPONDING TO ONE DATA INPUT/OUTPUT TERMINAL

[75] Inventor: Yuji Nakaoka, Tokyo, Japan
[73] Assignee: NEC Corporation, Tokyo, Japan
[21] Appl. No.: 702,536
[22] Filed: May 20, 1991
[30] Foreign Application Priority Data May 18, 1990 [JP] Japan .................................. 2-128841

[51] Int. Cl.[5] .......................... G11C 7/00; G11C 11/40
[52] U.S. Cl. ........................... 365/189.05; 365/189.09; 365/189.11; 365/203
[58] Field of Search ..................... 365/189.01, 189.09, 365/189.05, 189.06, 189.11, 203, 204

[56] References Cited
U.S. PATENT DOCUMENTS

| | | | |
|---|---|---|---|
| 4,821,232 | 4/1989 | Nakano et al. | 365/189.09 |
| 4,831,590 | 5/1989 | Ichinose | 365/189.05 |
| 4,870,617 | 9/1989 | Nakano et al. | 365/189.01 |

Primary Examiner—Siegfried H. Grimm
Attorney, Agent, or Firm—Sughrue, Mion, Zinn, Macpeak & Seas

[57] ABSTRACT

A semiconductor memory device including data bus lines each having one single wire line, and balance circuits each having an inverter for inverting a corresponding level of the data bus line, a capacitor which is connected at one end with the inverter and at the other end with a power source and has a capacitance substantially similar to the parasitic capacitance of the data bus line, and a transfer gate which receives control signals at a control terminal thereof connected between an end of the capacitor and the data bus line. The balance circuits set the potential level of the respective data bus line at an intermediate level between the power source potential and the ground potential. By structuring the device as above, data could be read out or written in by the data bus line provided in a one-to-one relation with one bit of input/output data to thereby reduce the area of the regions where data bus lines should be placed without impairing the operational speed.

15 Claims, 8 Drawing Sheets

SEMICONDUCTOR MEMORY DEVICE HAVING A SINGLE DATA BUS LINE CORRESPONDING TO ONE DATA INPUT/OUTPUT TERMINAL

BACKGROUND OF THE INVENTION

The present invention relates to a semiconductor memory device, and more particularly to a data bus line which is provided along the periphery of a semiconductor chip for the reading out/writing in of data.

DESCRIPTION OF THE PRIOR ART

A semiconductor memory device includes memory cell arrays each of which comprises plural memory cells in an array arrangement and plural bit lines and word lines respectively connected to the memory cells, and further includes a row decoder and a column decoder which are provided adjacent to a memory cell array for selecting a predetermined memory cell. Further, there are provided data bus lines as channels for reading out/writing in of data from or in the memory cell which has been selected by the row decoder and the column decoder. A data bus line is provided around the periphery of a semiconductor chip, and is connected to an output pad at one end thereof via an input/output buffer and to an I/O line (input/output line) at the other end thereof via either a data amplifier or a write amplifier.

There have been proposed various means to increase the speed of the operation of a semiconductor memory device of this type. One of the methods attempts to enhance the operational speed by setting the level of the data bus line at ½ Vcc or the medial level between the levels 0 and 1 immediately before it is supplied with the data which have been read out from or to be written in the memory cell array so that the level of the data bus line quickly follows the level of the particular data.

In the prior art, a data bus line comprises a pair of two wires of which levels are complementary to each other, and one data is supplied via such a pair. In order to make the level of the data bus line of the above structure at aforementioned ½ Vcc, there has conventionally been provided a means for short circuiting the two lines which form a pair. More specifically, as the levels of the two wires in a pair hold complementarily the level of one data until the next data is supplied, one of the wires is always set at a Vcc level while the other is set at a GND level. As these two wires have the same length, and hence the same line capacity, the gate capacities and capacities of diffusion layers of transistors connected to the wires are substantially similar to each other. Therefore, if two wires are short circuited by a gate transistor and the like before the next data is supplied, the level of the two lines becomes ½ Vcc simultaneously to thereby enhance the speed of the reading out/writing in operations.

However, if one data bus line is structured with a pair of two wires, the number of wires becomes too large. For example, in the semiconductor memory device of 4 bit input/output, four data bus lines or eight wires become necessary. This inevitably increases the area where these lines are wired to thereby pose a problem in integration of the semiconductor memory device.

The area could be reduced if one data bus line is structured with only one wire, but as this structure cannot set the level of the wire at ½ Vcc, it could not quite increase the operational speed.

BRIEF SUMMARY OF THE INVENTION

Objects of the Invention

Accordingly, an object of this invention is to provide a semiconductor memory device which could be highly integrated without impairing the speed of operation.

SUMMARY OF THE INVENTION

The semiconductor memory device according to this invention has memory cell arrays comprising plural memory cells in the form of an array and plural bit lines and word lines respectively connected to said memory cells, I/O line pairs of two wires connected to plural bit lines via selection circuits, data amplifiers and write amplifiers connected to I/O line pairs, input/output buffers connected to input/output pads, data bus lines comprising one single wire provided between the data amplifiers and the write amplifiers and the input/output buffers, an address detector which detects a change in the input address and generates an address change detection signal, a control signal generation circuit which generates a control signal responsively to a write control signal inputted from outside, and balance circuits which set the potential level of a data bus line at an intermediate level between the power source potential and the ground potential responsively to either the address change detection signal or the control signal.

A balance circuit preferably includes an inversion means which inverts the level of the data bus line(s), a capacitor element which is connected to the output of the inversion means at one end thereof and to the power source at the other end thereof and has a capacitance substantially similar to the parasitic capacitance of the data bus line, and a transfer gate connected between one end of the capacitor element and the data bus line.

BRIEF DESCRIPTION OF THE DRAWINGS

The above-mentioned and other objects, features and advantages of this invention will become more apparent by reference to the following detailed description of the invention taken in conjunction with the accompanying drawings wherein.

DETAILED DESCRIPTION OF THE INVENTION

Figure 1:
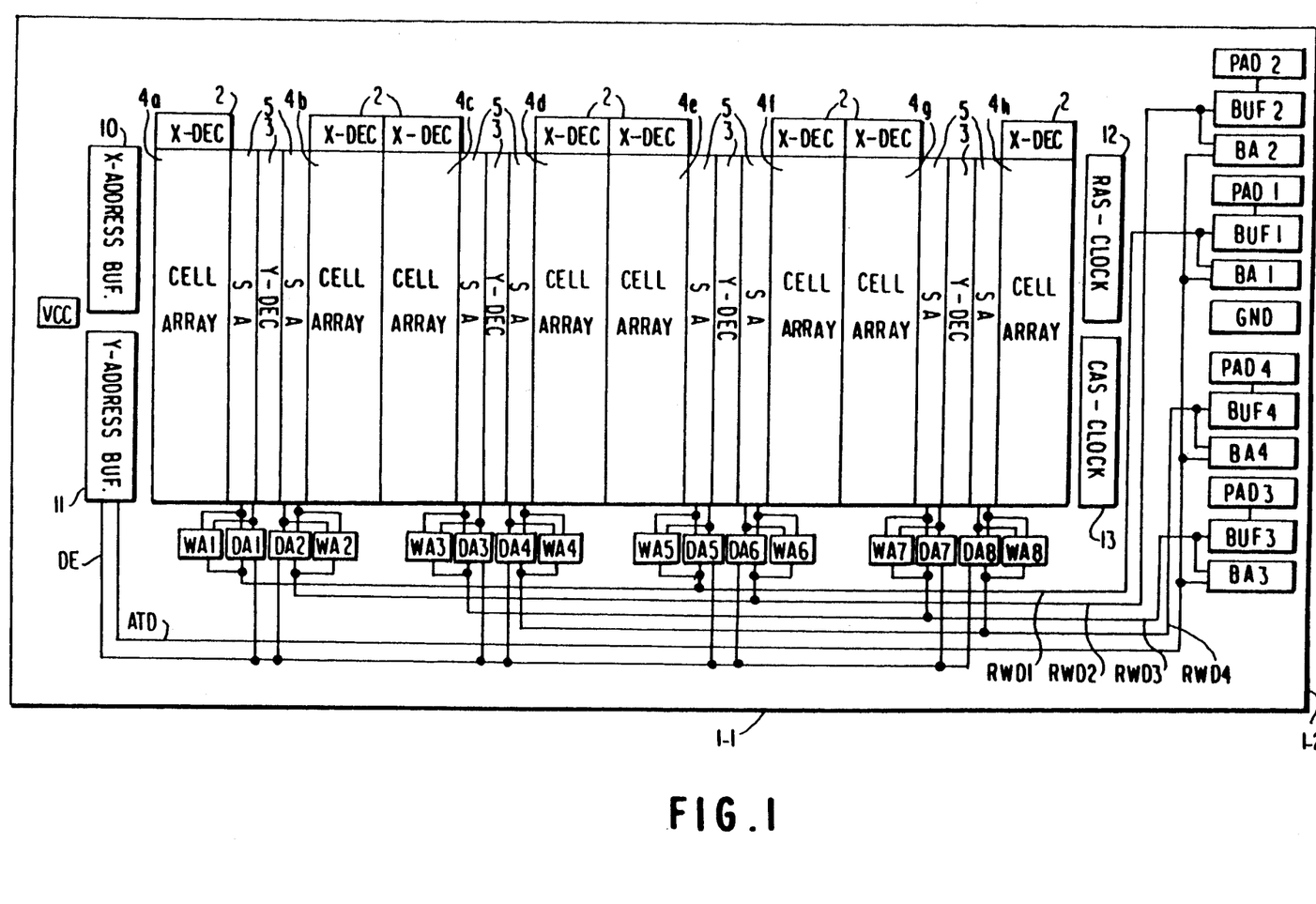
FIG. 1 is a plane view to show the whole structure of the first embodiment of the semiconductor memory device.

The first embodiment of the semiconductor memory device of this invention will now be described referring to FIG. 1. A 4M bit DRAM will be exemplified in the description. FIG. 1 is a plane view of a semiconductor chip of DRAM with the structure of 1M words×4 bits.

Within a semiconductor chip 1 are arranged eight memory cell arrays 4a, 4b, ... 4h of 512 rows×1024 columns or 512K bits in one lateral line to form memory cell arrays of 4M bits as a whole. One set of a row decoder 2 (referred to as X decoder herein), a column decoder 3 (Y decoder) and a sense amplifier 5 is provided for each of the memory cell arrays.

An I/O line comprising a pair of two wires having complementary levels (not shown) is provided between the Y decoder 3 and the sense amplifier 5 in parallel to the word lines as the channels for the data for reading out and writing in operation in a memory cell which is selected by the X decoder 2 and the Y decoder 3 out of the memory cell arrays 4a, 4b, ... 4h.

The I/O line pairs are connected to the bit line pairs of the memory cell arrays via selective switches which are controlled by the Y decoders and to data amplifiers DA1, DA2, ... DA8 and write amplifiers WA1, WA2, ... WA8 respectively outside of the cell array regions. Four data bus lines RWD1, RWD2, RWD3 and RWD4 run along one of the longitudinal sides 1—1 of the semiconductor chip 1. The four data bus lines RWD1, RWD2, RWD3 and RWD4 are connected at one end thereof to the data amplifiers DA1 and DA5, DA2 and DA6, DA3 and DA7, DA4 and DA8 respectively, and to the write amplifiers WA1 and WA5, WA2 and WA6, WA3 and WA7, WA4 and WA8 and at the other end to input/output pads Pad1, Pad2, Pad3 and Pad4 which are provided along one of the shorter sides 1-2 of the semiconductor chip 1 via input/output buffers BUF1, BUF2, BUF3 and BUF4 respectively.

This embodiment selects whether to actuate the memory cell arrays 4a, 4b, 4c and 4d or the memory cell arrays of 4e, 4f, 4g and 4h in accordance with the input X address. It is adapted to read out from or write in the data into the selected 4 memory cell arrays or one half of the total memory cell arrays via the four data bus lines RWD1, RWD2, RWD3 and RWD4.

The four data bus lines RWD1, RWD2, RWD3 and RWD4 are connected to balance circuits BA1, BA2, BA3 and BA4. The balance circuits BA1, BA2, BA3 and BA4 are provided on the shorter sides 1-2 of the chip to set the levels of the data bus lines RWD1, RWD2, RWD3 and RWD4 at ½ Vcc responsibely to the address change detection signals ATD which are supplied from an address detector provided inside the Y address buffer 11.

By constructing the circuit as above, this embodiment can read out or write in the data with only one data bus line instead of one pair for one bit of input/output data, and therefore the area where data bus lines are disposed can be reduced without impairing the operational speed. For example, in the case of a semiconductor memory device of 4 bit input/output, it was heretofore structured with eight wires or one pair for one bit in the data bus line, but according to this invention, the device can be structured with only four wires. This in turn could reduce the area of the region by about 16 μm in length in the direction of the shorter side of the semiconductor chip.

Figure 2:
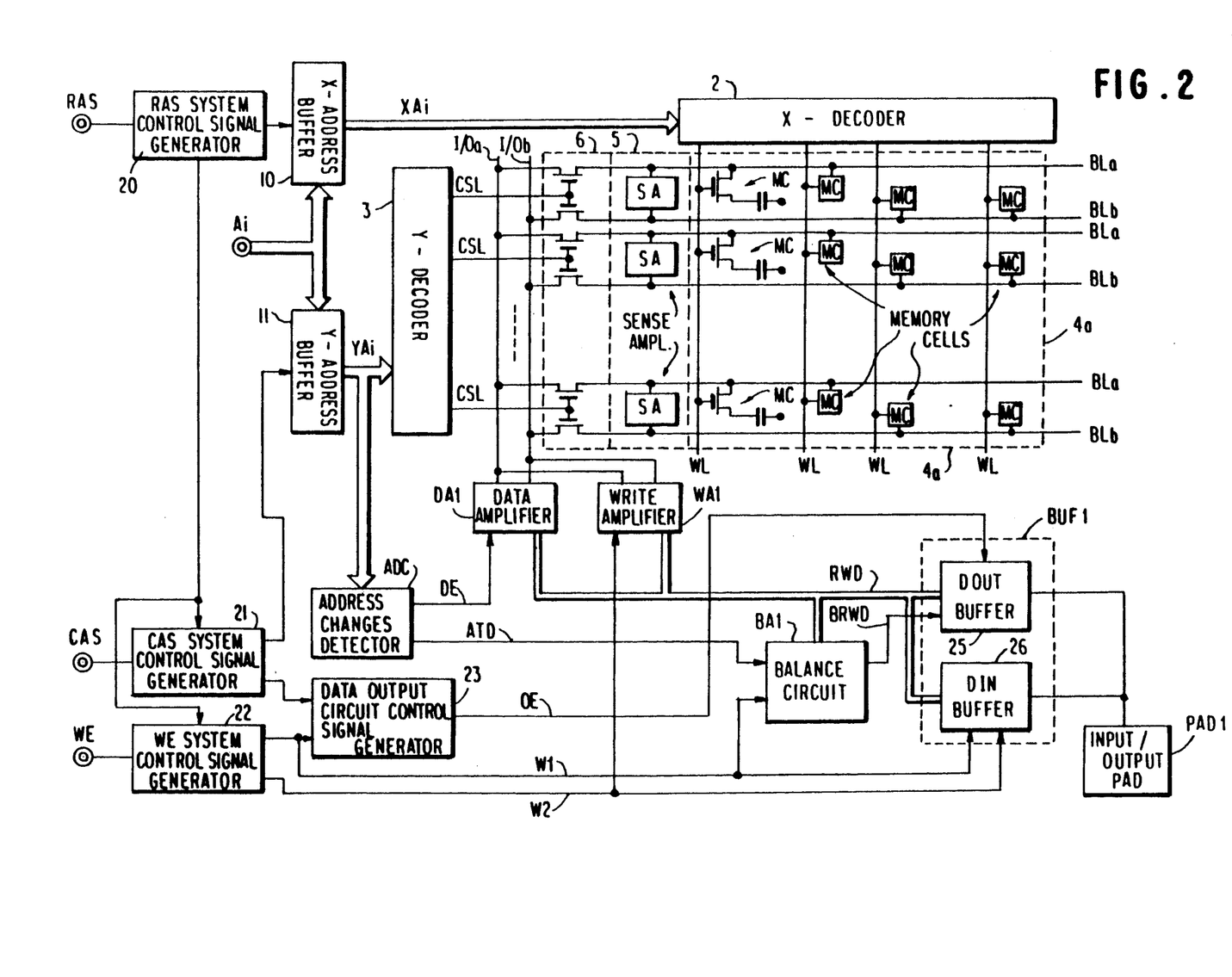
FIG. 2 is a circuit diagram to schematically show a part of the semiconductor memory device shown in FIG. 1.

This embodiment will now be described in more detail referring to FIG. 2. FIG. 2 is a circuit diagram to schematically explain the reading out/writing in operation of the memory cell array 4a of the semiconductor memory device 1 shown in FIG. 1. The same component parts are denoted with the same reference numerals.

The memory cell array 4a comprises cell MSs of the so-called one-transistor-one-capacitor type which are arranged in the form of an array, one cell comprising one N channel type MOS transistor and one capacitor. Plural bit lines which form one memory cell array 4a are paired in the unit of two complementary signal lines BLa and BLb and one sense amplifier SA is connected to each bit line pair. The bit line pairs are connected respectively to lines I/Oa and I/Ob forming a pair of I/O lines via a selection switch 6. The I/Oa and I/Ob are further connected to a data amplifier DA1 and a write amplifier WA1.

Address signals Ai are applied to plural address pads (not shown in FIG. 1) where an X address XAi is inputted into an X decoder 2 via an X address buffer 10 and a Y address is inputted into a Y decoder 3 and an address changes detector ADC via a Y address buffer 11 in time-division. The X decoder 2 selects one word line WL out of the cell array 4a responsively to the X address XAi while the Y decoder 3 controls the selection switch 6 responsively to the Y address YAi to connect one out of the plural bit line pairs to the lines I/Oa and I/Ob. The selection switch 6 comprises a group of transistors which receive selection signals CSL from the Y decoder 3 at gates and of which source-drain paths are provided between input/outputs of the sense amplifier SA and the I/Oa and I/Ob.

The address change detector ADC generates control signals DE for the data amplifier DA1 responsively to the Y address YAi in the reading out mode, and generates address change detection signals ATD for the balance circuit BA in the writing in mode.

External signals RAS, CAS and WE are applied to respective pads (not shown in FIG. 1) and inputted at a RAS system control signal generator 20, a CAS system control signal generator 21 and a WE system control signal generator 22 respectively. A data output circuit control signal generator 23 receives signals from the CAS system control signal generator 21 and from the WE system control signal generator 22 and generates control signals OE. The circuit 22 further generates control signals W1 and W2 to control the actuation of a balance circuit BA1, an input buffer 26, and a write amplifier WA1.

The data amplifier DA1 is actuated responsively to a control signal DE to amplify the levels of the lines I/Oa and I/Ob and outputs one of the data to a data bus line RWD. The write amplifier WA1 is actuated responsively to a control signal W2 to amplify the write in data on the data bus line RWD as a complementary data and supplies it to the lines I/Oa and I/Ob respectively.

The input/output buffer BUF1 comprises an output buffer 25 and an input buffer 26. The output buffer 25 is actuated responsively to a control signal OE to amplify the data on the data bus line RWD and outputs the data to the input/output pad Pad1. The input buffer 26 is actuated responsively to the control signals W1 and W2 to amplify the write in data inputted in the input/output pad Pad1 and outputs the data to the data bus line RWD.

The balance circuit BA1 is actuated responsively to the control signal W1 and the address change detection signal ATD to set the level of the data bus line RWD at ½ Vcc. Due to the structure which allows to set the level of the data bus line RWD at ½ Vcc, high speed operation becomes possible for reading out from or writing the data in the memory cell arrays.

More particularly, in the reading out mode, as the address detector ADC sets the address change detection signal ATD at active level, the balance circuit BA1 sets the level of the data bus line RWD at ½ Vcc. The data of a memory cell which is designated by an input address subsequently out of the memory cell array is supplied to the lines I/Oa and I/Ob, which is in turn amplified by the data amplifier DA1. As the level of the data bus line RWD has been set at ½ Vcc, the data bus line RWD could catch up rapidly with the level of the output data (0 or Vcc) of the data amplifier DA1. Then, the control signal OE assumes the active level, the output buffer 25 becomes active and outputs the data on the data bus line RWD to the input/output pad Pad1. In the reading out mode, the external signal WE is not inputted, and therefore the control signals W1 and W2 which are to be generated with the external signal becomes non-active to thereby render the write amplifier WA1 and the input buffer 26 non-active.

In the writing in mode, as external signal WE is inputted, W1 becomes active level first, and then the balance circuit BA1 sets the level of the data bus line RWD at ½ Vcc. Then, as the control signal W2 assumes the active level, the write in data which has been inputted at the Pad1 is amplified by the input buffer 26. As the level of the data bus line RWD has been set at ½ Vcc, the level (0 or Vcc) of the output from the input buffer 26 can quickly be followed by the data bus line RWD. The write amplifier WA1 is actuated by the control signal W2, the data on the RWD is amplified as the complementary data and supplied to the lines I/Oa and I/Ob respectively. The levels of the lines I/Oa and I/Ob are stored in a predetermined memory cell in the memory cell array to complete the writing in operation.

Figure 3:
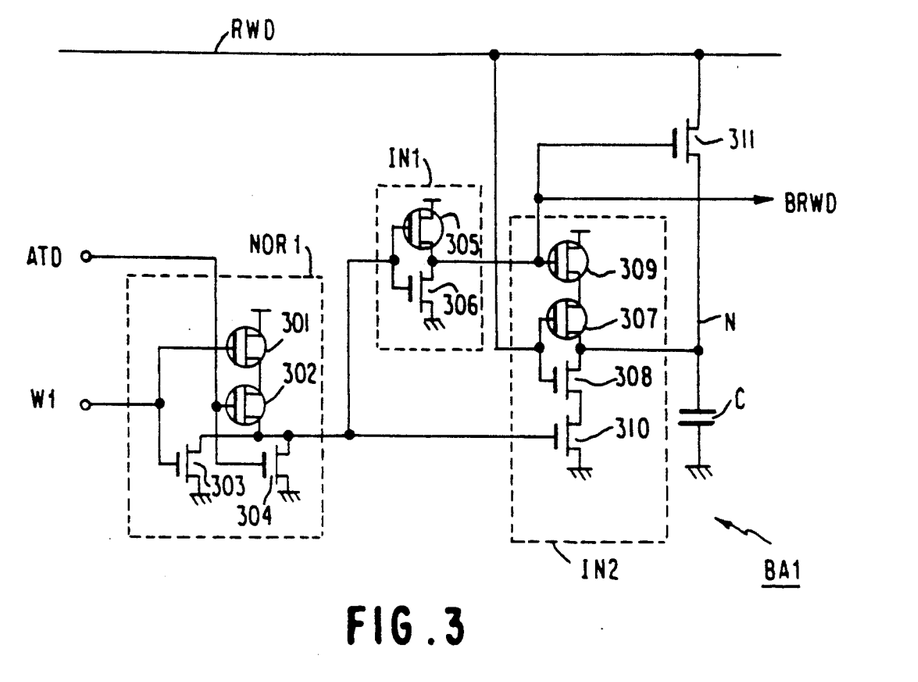
FIG. 3 is a circuit diagram to show the circuit structure of a balance circuit of the semiconductor memory device shown in FIG. 2.

Referring now to FIG. 3, an embodiment of the balance circuit BA1 shown in FIGS. 1 and 2 will now be specifically described for its structure. The balance circuit BA1 has a NOR gate NOR1 receiving two control signals at inputs thereof so as to be operable for the data bus line RWD when either one of the control signals ATD or W1 assumes the active level. The NOR gate NOR1 comprises a P channel transistor 302 and an N channel transistor 304 which receive ATD at gates, and a P channel transistor 301 and an N channel transistor 303 which receive W1 at gates. The output from the NOR gate NOR1 is connected to an input of a CMOS inverter IN1, and is connected to an activity control terminal of the inverter IN2 together with the output from the inverter IN1. The data bus line RWD is connected to an input of the inverter IN2. The inverter IN1 comprises a P channel transistor 305 and an N channel transistor 306 which are commonly connected at inputs to a gate and of which source drain paths are serially connected between the power source and the grounding. The inverter IN2 includes a P channel transistor 307 and an N channel transistor 308 which are connected at inputs with a common gate, and the drains of these transistors are commonly connected further to a node N as an output of the inverter IN2. The inverter IN2 further includes a P channel transistor 309 provided between the power source and the source of the P channel transistor 307 having a gate connected to an activity control terminal (an output of the inverter IN1), and an N channel transistor 310 which is provided between the grounding power source and the source of the N channel transistor 308 and has a gate connected to an activity control terminal (an output of the NOR gate NOR1) and controlled in activity by these two transistors 309, 310.

There is further provided an N channel transistor 311 of which source drain path is connected between the node N and the data bus line RWD, and a gate thereof is applied with an output from the CMOS inverter IN1. A capacitor C is connected at one end to the node N and at the other end to the grounding potential to hold the potential of the node N. The capacitance of the capacitor C is substantially equivalent to the sum of the parasitic capacitance of the data bus line RWD or the line capacitance of the line per set and gate capacitances of the plural transistors which are connected to the line or the diffusion capacitance of the source drain regions. For instance, in the case of 4M bit semiconductor memory device like this embodiment (chip size is 5.5 mm × 14.5 mm), as the parasitic capacitance of one data bus line RWD becomes about 5 to 6 pF (out of which the gate capacitance and diffusion capacitance are from 0.5 to 0.7 pF), the capacity of the element C is also set at about 5 to 6 pF.

The balance circuit BA1 with such a structure operates as follows. When both of the control signals ATD and W1 are at a non-active level (or at low level), the output of the NOR gate NOR1 assumes a high level and the output of the inverter IN1 assumes a low level. The P channel transistor 309 and the N channel transistor 310 of the inverter IN2 which receive both outputs become actuated to activate the CMOS inverter IN2. As a result, the inverter IN2 inverts the potential of the data bus line RWD and outputs it to the node N. As the gate of the N channel transistor 311 is applied with a low level, it is held non-active. Therefore, the capacitor C holds a potential level opposite to the data bus line RWD. (For example, if the level of the data bus line RWD is at the GND level, the capacitor holds the potential of Vcc.)

When either one of the control signals ATD or W1 assumes an active level (or high level), the output from the NOR gate NOR1 assumes the low level, the output from the inverter IN1 assumes the high level and the P channel transistor 309 and the N channel transistor 310 become non-active. Therefore, while the inverter IN2 becomes non-active, the N channel transistor 311 becomes actuated to electrically connect the node N with the data bus line RWD. As the capacitor C connected to the node N has held the potential opposite to the data bus line RWD up to this time, and its capacitance is almost the same as the parasitic capacitance of the data bus line RWD, when the N channel transistor 311 becomes actuated, one half of the electric charges of either the capacitor C or the data bus line RWD is transferred to either the data bus line RWD or the capacitor C and the potentials at the node N and at the data bus line RWD become ½ Vcc simultaneously.

The capacitance of the capacitor C is not necessarily precisely the same as the parasitic capacitance of the data bus line RWD. More specifically, this invention is characterized in that reading out/writing in operations could be conducted at high speed by means of a data bus line comprising one single line by using a balance circuit which makes the potential of the data bus line to be about the middle of the source potential and the grounding potential. Therefore, even if the potential of the data bus line deviates slightly from ½ Vcc when the balance circuit is operated, the speed in operation would not be affected and would not cause problems. The capacitor C can be designed considerably flexibly.

Referring to FIGS. 4 through 7, the specific circuit structures of the data amplifier DA1, the write amplifier WA1, the input buffer 25 and the output buffer 26 shown in FIGS. 1 and 2 will be described.

Figure 4:
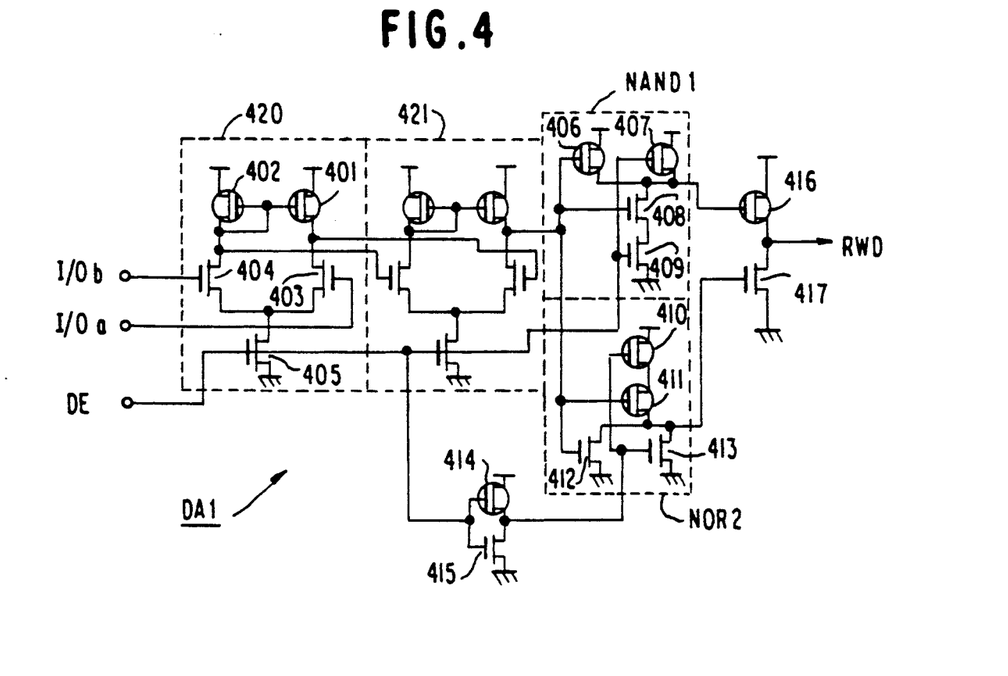
FIG. 4 is a circuit diagram to show the structure of a data amplifier of the semiconductor memory device shown in FIG. 2.

FIG. 4 is a circuit diagram to show the strucrure of the data amplifier DA1. The data amplifier DA1 is a circuit which amplifies the data on the lines I/Oa and I/Ob and supplies one of the data to the data bus line RWD, and includes two differential circuits 420, 421 of the same structure and output sections for a NAND gate NAND1, a NOR gate NOR2, and the data bus line RWD. The first differential circuit 420 is connected at its gate to the pair of lines I/Oa and I/Ob respectively, includes transistors 403 and 404 which form a differential pair, loaded with a current mirror circuit comprising transistors 401 and 402, and controlled in activity by the state of the N channel transistor 405 which receives at the gate thereof the control signal DE from the address detector ADC (FIG. 2).

The second differential circuit 421 of the same structure is connected to the first differential circuit 420 for another section, and one of the outputs thereof is inputted at the NAND gate NAND1 comprising P channel transistors 406, 407 and the N channel transistors 408, 409 and the NOR gate NOR2 comprising the P channel transistors 410, 411 and the N channel transistors 412, 413. The NAND gate NAND1 receives a control signal DE at another input while the NOR gate NOR2 receives the signal obtained by inverting the control signal DE by a CMOS inverter comprising a P channel transistor 414 and an N channel transistor 415 at another input.

The respective outputs from the NAND gate NAND1 and the NOR gate NOR2 are applied to the gates of the P channel transistor 416 of which source drain path is connected between the power source and output and of the N channel transistor 417 of which source drain path is connected to the output and grounding potential, and its output signal is supplied to the data bus line RWD.

Figure 5:
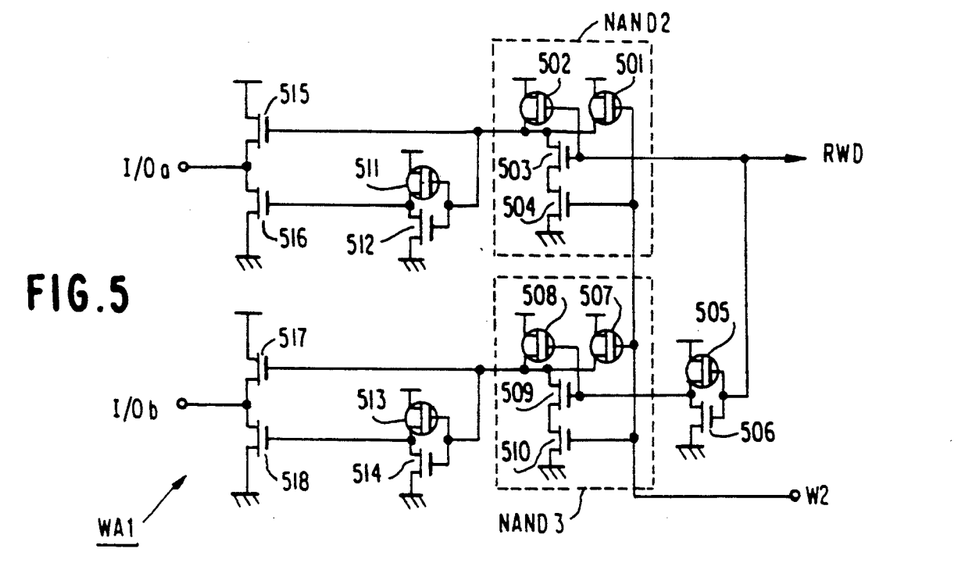
FIG. 5 is a circuit diagram to show the circuit structure of the write amplifier of the semiconductor memory device shown in FIG. 2.

FIG. 5 is a circuit diagram to show the structure of the write amplifier WA1. The write amplifier WA1 is a circuit which amplifies the data on the data bus line RWD to two data which are complementary to each other and includes two NAND gates NAND2 and NAND3 of the same structure and two outputs sections for the lines I/Oa and I/Ob.

The data on the data bus line RWD is inputted at the NAND gate NAND2 comprising P channel transistors 501, 502 and N channel transistors 503, 504 while the signal obtained by inverting the data on the data bus line RWD by the CMOS inverter comprising P channel transistor 505 and N channel transistor 506 is inputted at the NAND gate NAND3 comprising P channel transistors 507, 508 and N channel transistors 509, 510.

The NAND gates NAND2 and NAND3 receive as other inputs the control signals W2 supplied from the WE system control signal generator 22 (FIG. 2) and are controlled of their activity thereby.

The output from the NAND gate NAND2 and the signal obtained by inverting the output by a CMOS inverter comprising a P channel transistor 511 and an N channel transistor 512 are applied respectively at a gate of the N channel transistor 515 which is an output section for the line I/Oa and of which source drain path is connected between the power source and an output and at the gate of the N channel transistor 516 of which source drain path is connected between an output and the grounding potential, and the output signals therefrom are supplied to the line I/Oa.

Similarly, the output from the NAND gate NAND3 and the signal obtained by inverting the output by a CMOS inverter comprising a P channel transistor 513 and an N channel transistor 514 are applied respectively at a gate of the N channel transistor 517 and a gate of the N channel transistor 518 of which source and drain path are connected to an output and the grounding potential, and the output signals therefrom are supplied to the line I/Ob.

The reason why transistors 515, 517 forming an output section are made with N channel transistors is because the levels of the lines I/Oa and I/Ob are made to be close to Vcc when the control signal W2 is at a non-active level (low level) or in the reading out mode.

Figure 6:
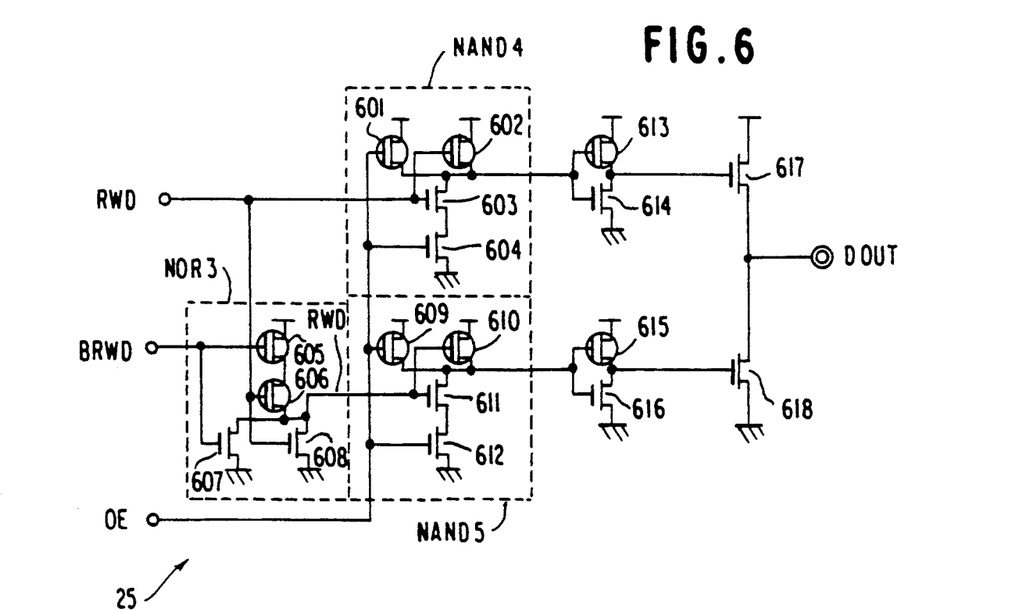
FIG. 6 is a circuit diagram to show the structure of an output buffer of the semiconductor memory device shown in FIG. 2.

FIG. 6 is a circuit diagram to show the structure of an output buffer 25. The output buffer 25 amplifies the data on the data bus line RWD, supplies the data to the input/output pad Pad (FIG. 2), and comprises a NOR gate NOR3, NAND gates NAND4 and NAND5 of the same structure and output sections.

The data on the data bus line RWD are inputted at the NOR gate NOR3 comprising P channel transistors 605, 606 and N channel transistors 607, 608, and a NAND gate NAND4 comprising P channel transistors 601, 602 and N channel transistors 603, 604. The NOR gate NOR3 receives as another input a control signal BRWD supplied from the balance circuit BA1 (FIG. 1). Further, the output from the NOR gate NOR3 is inputted at the NAND gate NAND5 comprising P channel transistors 609, 610 and N channel transistors 611, 612. The NAND gates NAND4 and NDND5 receive as other inputs the control signals OE supplied from the data output circuit control signal generator 23 (FIG. 2) and are controlled in respect of their activity thereby.

The outputs from the NAND gates NAND4 and NAND5 are respectively applied at the gate of the N channel transistor 617 which forms an output section for the output DOUT and of which source drain path is connected between the power source and an output and the gate of an N channel transistor 618 of which source drain path is connected between an output and the grounding potential via a CMOS inverter comprising a P channel transistor 613 and an N channel transistor 614 and a CMOS inverter comprising a P channel transistor 615 and an N channel transistor 616, and an output signal therefrom is supplied to an output DOUT. The output DOUT is connected to the input/output pad PAD1 (FIG. 2).

Figure 7:
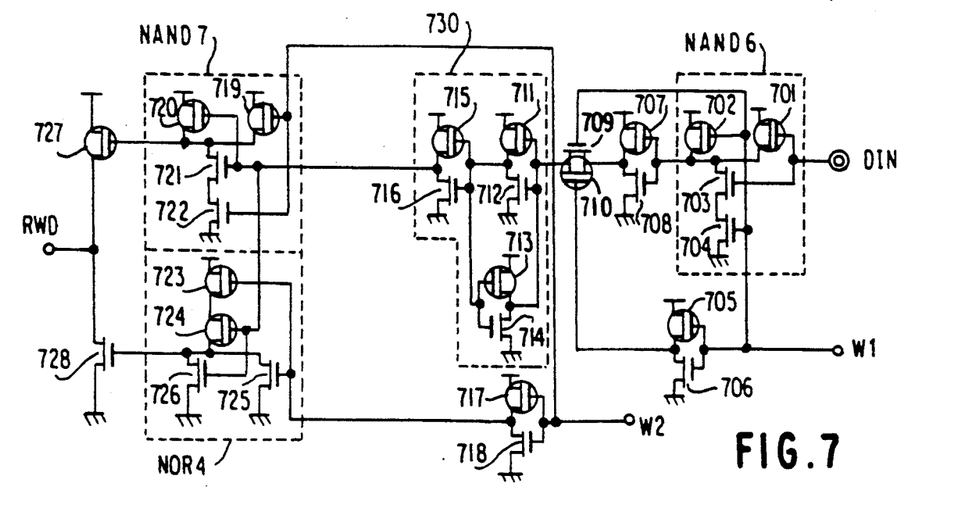
FIG. 7 is a circuit diagram to show the structure of an input buffer of the semiconductor memory device shown in FIG. 2.

FIG. 7 is a circuit diagram to show the structure of the input buffer 26. The input buffer 26 is a circuit which amplifies the write in data inputted from the input/output pad Pad1 and supplies it to the data bus line RWD, and includes a latch circuit 730, the NAND gates NAND6 and NAND7, a NOR gate NOR4 and an output section for the data bus line.

The write in data inputted from the input/output Pad1 is inputted at a NAND gate NAND6 comprising the P channel transistors 701, 702 and the N channel transistors 703, 704 from an input DIN. The NAND gate NAND5 receives as other input the control signal W1 supplied from the WE system control signal generator 22 (FIG. 2) and is controlled in its activity thereby. The output from the NAND gate NAND6 is inverted by a CMOS inverter comprising a P channel transistor 708 and the inverted signal is applied to a transfer gate comprising an N channel transistor 709 which receives at its gate the control signal W1 and the inverted signal and a P channel transistor 710.

The output signal from the transfer gate is stored at a latch circuit 730 which comprises a CMOS inverter comprising a P channel transistor 711 and an N channel transistor 712, a CMOS inverter comprising P channel transistor 713 and an N channel transistor 714, and a CMOS inverter comprising a P channel transistor 715 and an N channel transistor 716. The output from the latch circuit 730 is inputted at a NAND gate NAND7 comprising P channel transistors 719, 720 and N channel transistors 721, 722, and a NOR gate NOR4 comprising P channel transistors 723, 724, and N channel transistors 725, 726. The NAND gate NAND7 is controlled in the activity as it receives as another input the control signal fed from the WE system control signal generator 22 (FIG. 2), while the NOR gate NOR4 is controlled in its activity as it receives as another input the signal obtained by inverting the control signal W2 by the CMOS inverter comprising a P channel transistor 717 and an N channel transistor 718.

The outputs respectively from the NAND gate NAND7 and the NOR gate NOR4 are applied at the gate of the P channel transistor 727 of which source drain path is connected between the power source and the output and at the gate of the N channel transistor 728 of which source drain path is connected between the output and the grounding potential, and the output therefrom is supplied to the data bus line RWD.

Figure 8:
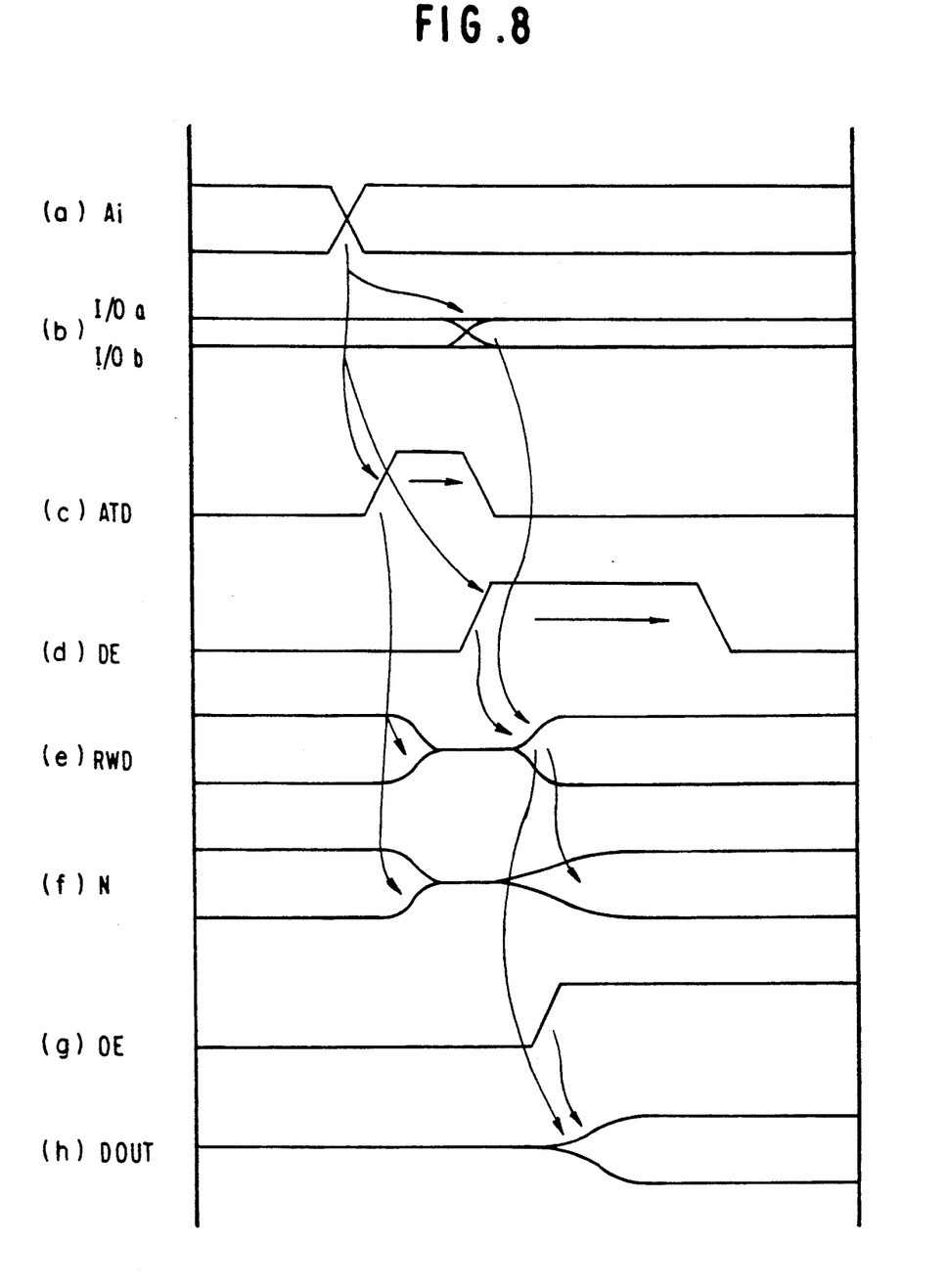
FIG. 8 is a waveform chart to explain the reading out operation of the semiconductor memory device shown in FIG. 2.
Figure 9:
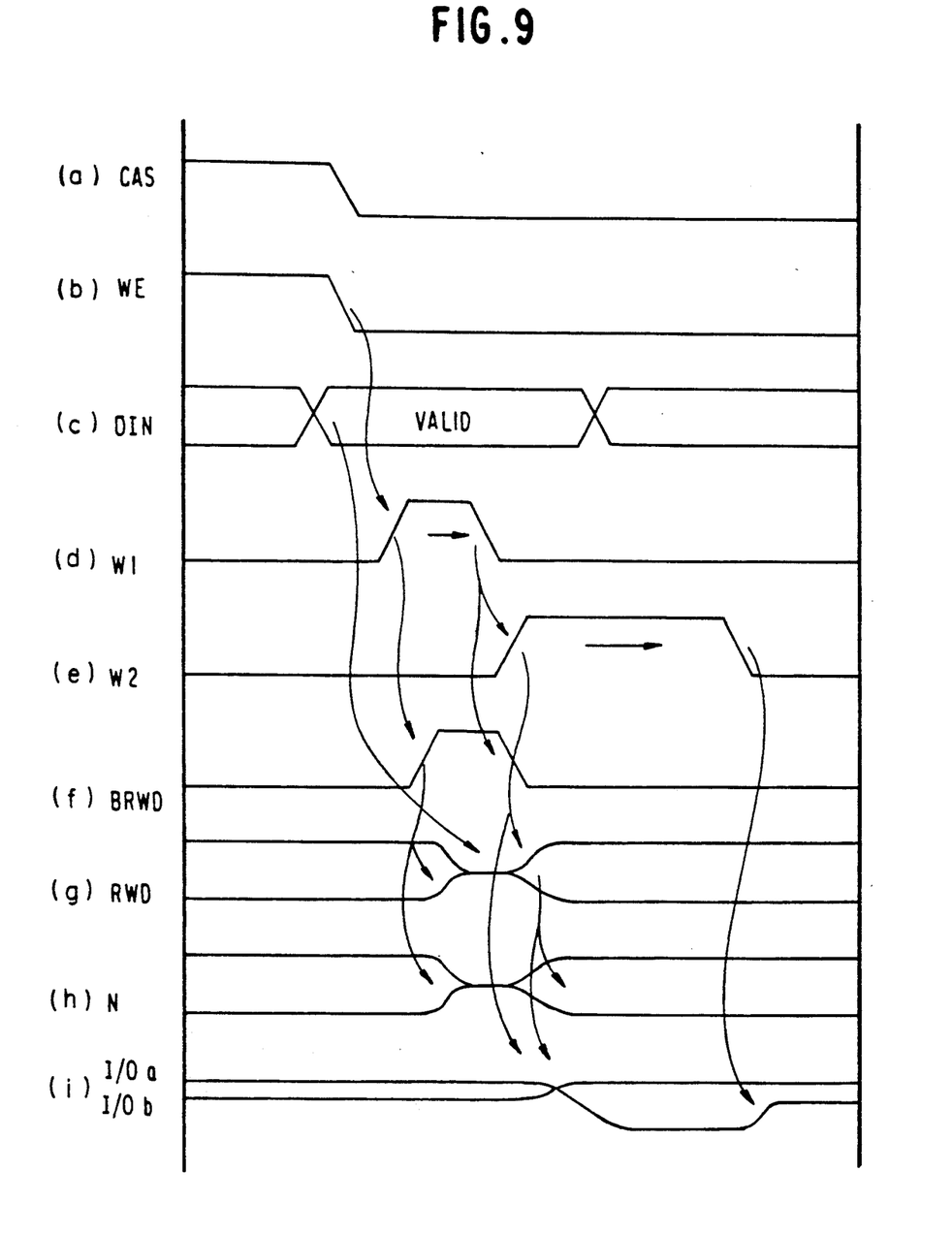
FIG. 9 is a waveform chart to explain the writing in operation of the semiconductor memory device shown in FIG. 2.

Referring now to FIGS. 8 and 9, reading out and writing in operations of the semiconductor memory device shown in FIGS. 2 through 7 are described below.

FIG. 8 is a view to show waveforms in the mode of reading out. When an address Ai is inputted (FIG. 8(a)), the address detector ADC (FIG. 2) raises the address change detection signals ATD to a high level (FIG. 8(c)). When the ATD becomes high level, the data bus line RWD in the balance circuit BA1 and the transistor 311 provided at the node N are conducted (FIG. 3), the levels at the node N and at the data bus line RWD simultaneously become ½ Vcc (FIG. 8(e), (f)).

A memory cell which is predetermined correspondingly to the input address Ai is selected, and the levels of the lines I/Oa (FIG. 2) and I/Ob are set at a Vcc and a level lower than Vcc which are complementary to each other responsively to the data stored in the particular memory cell (FIG. 8(b)).

Then, the address change detector ADC (FIG. 2) raises the control signal DE to a high level (FIG. 8(d)) to activate the data amplifier DA1 (FIG. 4), and the level of either one of the lines I/Oa and I/Ob is amplified and is outputted to the data bus line RWD. By this time, as the level of the data bus line RWD has been set at ½ Vcc the balance circuit BA1, it can reach the level 0 (GND level) or 1 (Vcc level) in short time (FIG. 8(e)).

As a CAS signal is inputted to control signal generator 21, the data output control signal generator 23 (FIG. 2) starts its operation to raise the control signal OE to a high level (FIG. 8(g)). With the signal OE, the output buffer 25 (FIG. 6) is activated to amplify the data on the data bus line RWD and to output it to the output DOUT (FIG. 8(h)).

As described above, the address change detector ADC (FIG. 2) quickly responds to the change in address, raises the address change detection signal ATD, and activates the balance circuit BA1 before the memory cell array starts the reading out operation to set the potential of the data bus line RWD at ½ Vcc. When the memory cell array reads out the data and outputs the data to the data bus line, the circuit ADC lowers the signal ATD to a low level before the potential of the line RWD is established (FIG. 8(c)). In the reading out mode, as the control signal W1 is held at the low level, the NOR gate NOR1 of the balance circuit BA1 (FIG. 3) makes the output high level when the ATD signal assumes a low level to activate the inverter IN2 as well as to isolate the node N from the data bus line RWD by turning off the transistor 311. The activated inverter IN2 gives the inverted value to the node N responsively to the data of the data bus line RWD. More specifically, if the read out data is at a high level, the inverter IN2 discharges the residual charge of the capacitor C to turn the node N to a low level while if the read out data is at low level, the capacitor C is charged and the node N is set at high level (FIG. 8(f)).

The address changes detector ADC lowers the control signal DE to a low level at a timing after the data is started to be outputted at the output DOUT (FIG. 8(d)), makes the data amplifier DA1 non-active, and isolates the data bus line RWD from the I/O line.

FIG. 9 is a waveform chart to explain the operation in the writing in mode. When external signals CAS and WE (FIG. 2) are inputted (FIG. 9(a) and 9(b)), the WE system control signal generator 22 raises the control signal W1 (FIG. 9(d)) and lowers the output OE of the control circuit 23 (not shown). When W1 becomes high level, the output of the inverter IN1 in the balance circuit BA1 (FIG. 3) is raised to raise BRWD (FIG. 9(f)), the transistor 311 provided between the data bus line RWD and the node N in the balance circuit BA1 is conducted to set the levels of the node N and of the data bus line RWD at ½ Vcc simultaneously (FIG. 9(g) and 9(h)). When the signal BRWD from the balance circuit RA1 assumes a high level, the output from the NOR gate NOR3 which receives as input the data bus line RWD of the output buffer 25 (FIG. 6) assumes a low level irrespective of the RWD, and as the control signal OE has been set at a low level, two NAND gates NAND4 and NAND5 raise their outputs to a high level. This sets in turn the inputs at the output transistors 617, 618 at low level and turns them off to set the output DOUT at the high impedance state, which prevents the potential of the RWD set at ½ Vcc from being outputted.

At the input buffer 26 (FIG. 7), on the other hand, as W1 is set at a high level, the write in data inputted from the input DIN (FIG. 9(c)) is stored at the latch circuit 730. Then, the WE system control signal generator 22 (FIG. 2) raises the control signals W1 and W2 (FIG. 9(d) and 9(e)). This isolates the latch circuit 730 of the input buffer 26 (FIG. 7) from the input DIN and at the same time the two gates NAND7 and NOR4 which receive the output as inputs are permitted to operate and the input data ia amplified to be outputted to the data bus line RWD. As the level at the data bus line RWD has been set at ½ Vcc by the balance circuit BA1, it quickly returns to either the level of 9 (GND level) or of 1 (Vcc level) (FIG. 8(g)).

As the W2 rises, the write amplifier WA1 is activated, and the data on the data bus line RWD is amplified as a complementary data and supplied to the lines I/Oa and I/Ob (FIGS. 5 and 9(i)). The levels on the lines I/Oa and I/Ob are stored as complementary data in a predetermined memory cell to complete the writing in operation.

As the control signal W1 assumes a low level at the balance circuit BA1 (FIG. 3), the output from the NOR gate NOR1 assumes a high level to thereby activate the inverter IN2 which had been non-active up to that time, as well as to turn off the transistor 311. This causes the capacitor C discharged to set the node N at a low level when the input data on the data bus line RWD is at a high level, and conversely causes the capacitor C charged to set the node N at a high level when the input data is at a low level. In other words, the node N is maintained at a level opposite to the level of the data bus line RWD (FIG. 9(h)).

Then, the control signal W2 is raised to make the write amplifier WA1 non-active.

Figure 10:
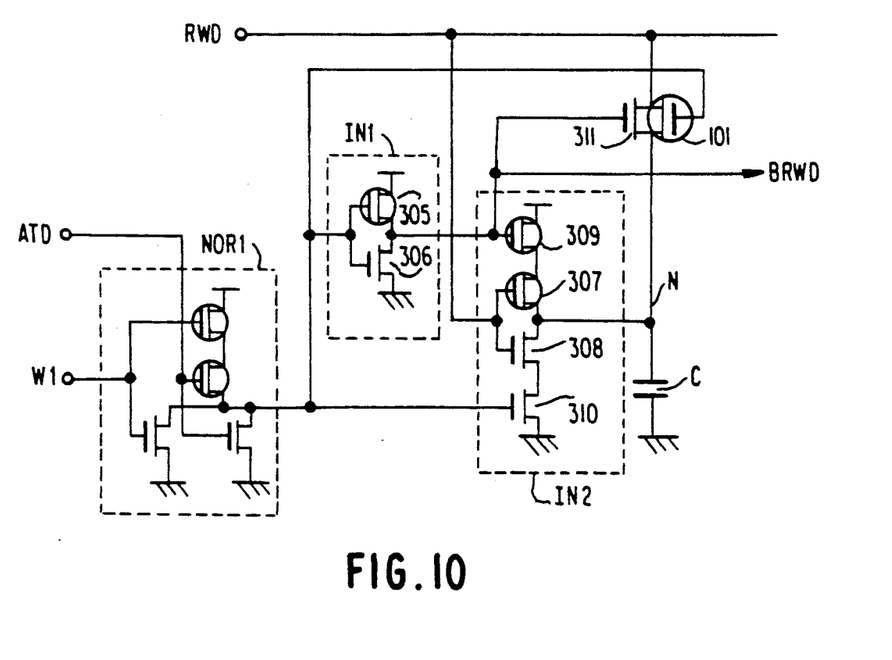
FIG. 10 is a circuit diagram to show the structure of the balance circuit in the second embodiment of the semiconductor memory device of this invention.

Referring to FIG. 10, the second emhodiment of this invention will now be described. FIG. 10 is a circuit diagram to show the structure of the balance circuit BA1. This circuit differs from the balance circuit described in relation to FIG. 3 in that a P channel transistor 101 for controlling the conduction between the data bus line RWD and the node N by the signal outputted from the NOR gate NOR1 is provided in addition to the N channel transistor 311. This structure enables quick electric connection of the node N with the data bus line RWD responsively to the address change detection signal ATD.

Figure 11:
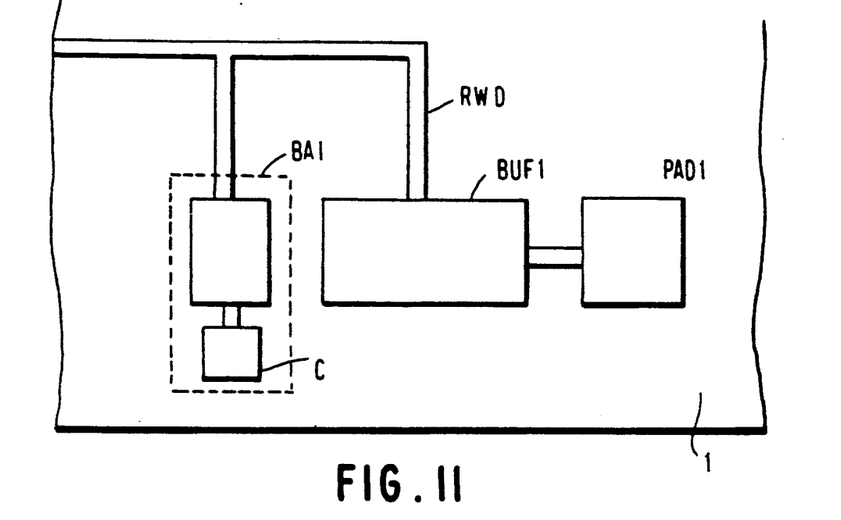
FIG. 11 is a plane view to show the arrangement of the balance circuit shown in FIGS. 3 and 10 on a semiconductor chip.

The arrangement of the balance circuit BA on a semiconductor chip 1 will be described referring to FIGS. 11 and 12.

There is basically no significant difference in the positional arrangement of the balance circuit BA on a semiconductor chip shown FIGS. 3 and 10. Therefore, it is preferable to arrange the balance circuit in a region which is available after laying out of the peripheral circuits or in a so-called dead space in order to contribute to the integration of the semiconductor chip. For instance, as shown in FIG. 11, the circuit is arranged adjacent to the input/output buffer BUF1, and particularly the capacitor C which should occupy a large area is arranged at the outermost region of the semiconductor chip. This arrangement can greatly enhance integration of the chip.

If the capacitor C is structured with an ordinary capacitor, and if the capacitance of the capacitor is from 5 to 7 pF, the size will be about 50 μm×50 μm, which is small enough to be placed at outermost region.

Figure 12:
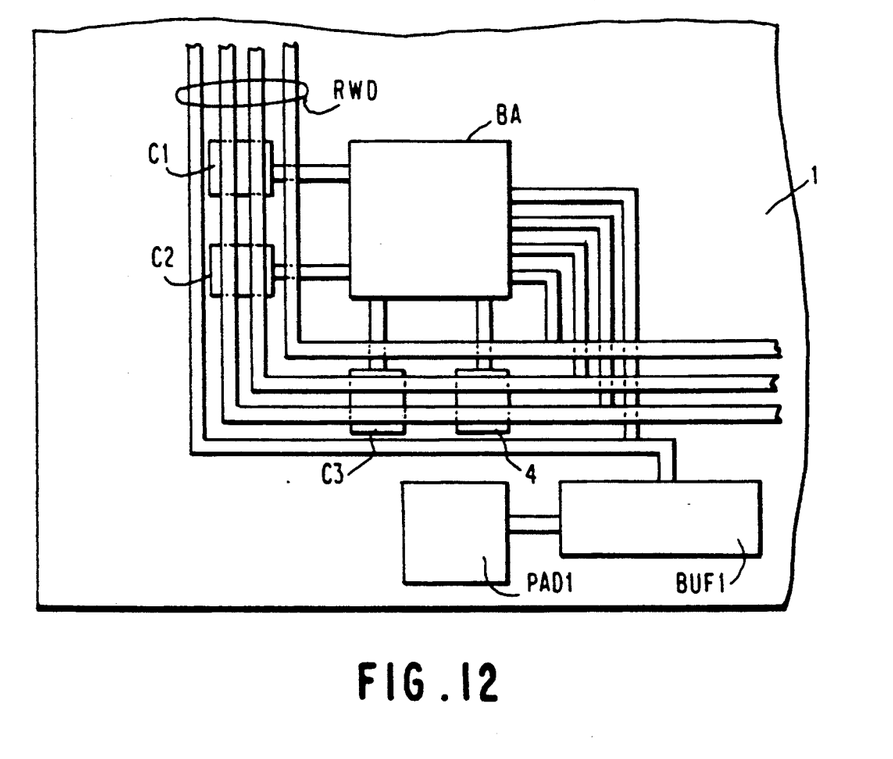
FIG. 12 is a plane view to show another arrangement of the balance circuit shown in FIGS. 3 and 10 on a semiconductor chip.

Further as shown in FIG. 12, instead of providing a balance circuit for each one of the data bus lines at different locations, it becomes possible to integrally arrange the balance circuits in a number corresponding to the number of data bus lines (four in this embodiment) at one location.

It is further possible to form a capacitor at the lower layer of the wiring layers, for instance as shown in FIG. 12, to thereby form a balance circuit at any available location without taking trouble to create an additional region.

Although a data bus line for DRAM has been described as an example in the foregoing statement in relation to embodiments, this invention is not limited to DRAMs but is also applicable to SRAM (static RAM) data bus lines.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

I claim:

1. A semiconductor memory device comprising a data terminal, a data buffer circuit connected to said data terminal, a data bus line connected to said data terminal and connected to said data buffer circuit, a capacitor element having a capacitance substantially similar to a parasitic capacitance of said data bus line, a means to detect the level of said data bus line and to set the potential of said capacitor element at such a level that is obtained by inverting the level of said data bus line, and a means for connecting said capacitor element with said data bus line for a predetermined time period.

2. The semiconductor memory device as claimed in claim 1, wherein the means to set said inverted level is an inverter which is connected at an input thereof with said data bus line and at an output with one end of said capacitor element.

3. The semiconductor memory device as claimed in claim 2, wherein said capacitor element is grounded at the other end.

4. The semiconductor memory device as claimed in claim 1, wherein said connecting means is a transfer gate which is connected with said data bus line at one end and with said capacitor element at the other end, and at the control terminal with a means for generating first control signals during said predetermined time period.

5. The semiconductor memory device as claimed in claim 4, wherein the means for setting said inverted level is an inverter which is connected at an input with said data bus line and at an output with said capacitor element and which is activated when it receives second control signals.

6. The semiconductor memory device as claimed in claim 5, wherein said second control signals are the signals obtained by inverting said first control signals.

7. The semiconductor memory device as claimed in claim 4, wherein said means for generating the first control signals includes a means for receiving address signals, a means for generating an address change detection signal when said address signals change, and a means for generating said first control signals responsively to said address change detection signal.

8. The semiconductor memory device as claimed in claim 4, wherein said means for generating the first control signal includes a means for receiving write in control signals which are inputted from outside, a means for generating a third control signal corresponding to said write in control signal, and a means for generating said first control signal correspondingly to said third control signal.

9. The semiconductor memory device as claimed in claim 4, wherein said transfer gate is a field-effect transistor having a source-drain path connected between said data bus line and said capacitor element and having a gate which receives said first control signals.

10. The semiconductor memory device as claimed in claim 4, wherein said transfer gate comprises a one conductivity type transistor and an opposite conductivity type field-effect transistor.

11. The semiconductor memory device as claimed in claim 1, wherein said data buffer circuit includes an input buffer circuit and an output buffer circuit, and is connected to one end of said data bus line while the other end of said data bus line is connected to a data amplifier and a write in amplifier.

12. The semiconductor memory device as claimed in claim 1, wherein said capacitor element is arranged at the outer periphery of a semiconductor chip.

13. The semiconductor memory device as claimed in claim 1, wherein said capacitor element is placed below the wiring layer arranged within the semiconductor chip.

14. A semiconductor memory device including memory cell arrays having a plurality of memory cells arranged in an array and plural bit lines and word lines respectively connected to said memory cells, I/O line pairs of two wires which are connected to said plural bit lines via a switching circuit, data amplifiers and write amplifiers connected to said I/O line pairs, input/output pads, input/output buffers connected to said input/output pads, data bus lines in a number having one-to-one relation to said input/output pads which are provided between said data amplifiers and write amplifiers and said input/output buffers, an address change detector circuit which detects a change in an input address and generates an address change detection signal, a control signal generator circuit which generates control signals correspondingly to write in control signals inputted from outside, and a balance circuit which sets the potential level of said data bus line at an intermediate level between the power source potential and the grounding potential correspondingly to either one of said address change detection signal and said control signal.

15. The semiconductor memory device as claimed in claim 14, wherein said balance circuit includes an inverter means for inverting the level of said data bus line, a capacitor element which is connected at one end with the output of said inverter means and at the other end with the power source, a transfer gate which is connected between one end of said capacitor element and said data bus line and which has control terminals, and a means which generates signals to activate said transfer gate responsively to either one of said control signal and said address change detection signal and applies the signals to said control terminal of said transfer gate.

* * * * *

UNITED STATES PATENT AND TRADEMARK OFFICE
CERTIFICATE OF CORRECTION

PATENT NO. : 5,245,573

DATED : September 14, 1993

INVENTOR(S) : Yuji NAKAOKA

It is certified that error appears in the above-identified patent and that said Letters Patent is hereby corrected as shown below:

Col. 7, line 23, delete "strucrure" and insert --structure--.
Col. 8, line 51, delete "NDND5" and insert --NAND5--.
Col. 11, line 33, delete "emhodiment" and insert --embodiment--.

Signed and Sealed this

Twenty-second Day of November, 1994

Attest:

BRUCE LEHMAN

Attesting Officer     Commissioner of Patents and Trademarks